United States Patent
Hadjichristos

(10) Patent No.: US 7,072,626 B2
(45) Date of Patent: Jul. 4, 2006

(54) POLAR MODULATION TRANSMITTER

(75) Inventor: Aristotle Hadjichristos, Apex, NC (US)

(73) Assignee: Telefonaktiebolaget LM Ericsson (publ) (SE)

( * ) Notice: Subject to any disclaimer, the term of this patent is extended or adjusted under 35 U.S.C. 154(b) by 516 days.

(21) Appl. No.: 10/426,510

(22) Filed: Apr. 30, 2003

(65) Prior Publication Data

US 2004/0219891 A1    Nov. 4, 2004

(51) Int. Cl.
*H04B 1/04*    (2006.01)

(52) U.S. Cl. .................. 455/126; 455/116; 455/108; 330/295

(58) Field of Classification Search ............... 330/10, 330/149, 251, 295, 207, 136; 455/102, 116, 455/126, 91, 113, 115.1
See application file for complete search history.

(56) References Cited

U.S. PATENT DOCUMENTS

| | | | |
|---|---|---|---|
| 6,147,553 A * | 11/2000 | Kolanek | ........................ 330/10 |
| 2002/0141510 A1 | 10/2002 | Sridharan et al. | |
| 2003/0035494 A1 | 2/2003 | Bauder et al. | |
| 2003/0072388 A1 | 4/2003 | Yellin et al. | |
| 2003/0109234 A1* | 6/2003 | Shi | ............................ 455/116 |

| | | |
|---|---|---|
| 2004/0021516 A1 | 2/2004 | Oishi et al. |

FOREIGN PATENT DOCUMENTS

| | | |
|---|---|---|
| FR | 2807252 | 10/2001 |
| WO | WO 0124356 | 4/2001 |
| WO | WO 0233820 | 4/2002 |
| WO | WO 02/061938 | 8/2002 |
| WO | WO 02078281 | 10/2002 |

* cited by examiner

*Primary Examiner*—Nguyen T. Vo
*Assistant Examiner*—Nhan T. Le
(74) *Attorney, Agent, or Firm*—Coats & Bennett, P.L.L.C.

(57) ABSTRACT

A polar modulation transmitter circuit provides reduced ACPR in its output signal by controlling the relative delay between its envelope and phase modulation operations based on direct or indirect feedback measurement the output signal's ACPR. Such measurement and associated control may be based on a delay controller that includes an ACPR measurement circuit and a delay control circuit. Additionally, or alternatively, the polar modulation transmitter circuit provides a greatly extended transmit power control range by using a staged amplifier circuit that includes a driver amplifier circuit operating in combination with a power amplifier circuit to impart desired envelope modulation. In an exemplary embodiment, the driver amplifier circuit is implemented as differential transistor pairs responsive to tail current modulation. As such, the driver amplifier circuit is suited in particular for economical and space saving integration within a transmitter or transceiver integrated circuit (IC).

29 Claims, 8 Drawing Sheets

POLAR MODULATION TRANSMITTER

BACKGROUND OF THE INVENTION

The present invention generally relates to wireless communication and particularly relates to polar modulation methods and apparatus.

Current and evolving wireless communication standards, such as WCDMA (Wideband CDMA), EDGE (Enhanced Data Rates through GSM Evolution), and GSM (Global System for Mobile communications), combine a variety of digital modulation formats. Such formats include 8-QPSK modulation, various QAM implementations, GMSK modulation, etc. Of the several aims embodied in these current and developing wireless standards are increased data rates and increased spectral efficiency.

Achieving such aims involves, in part, the use of relatively complex digital modulation formats, which impose stringent linearity requirements for transmit signal generation. Biasing transmitter power amplifiers to linear operating points may satisfy amplifier linearity requirements, but does so at the expense of power efficiency. Such power inefficiency runs at cross-purposes to achieving low overall operating power and, in the context of portable communication devices, severely limits battery life.

Polar modulation transmitters stand as alternative to transmitters based on conventional linear amplifiers. Polar modulation splits the transmit information stream into coordinated streams of phase and amplitude information. The phase information modulates a radio frequency carrier signal having a constant signal envelope, and a saturated power amplifier receives this phase-modulated signal as its input signal. An amplitude modulation controller, such as a controlled voltage or current source modulates the supply power to the saturated power amplifier and thereby imparts amplitude modulation to the amplifier's output signal. Thus, polar modulation techniques enable linear amplitude modulation while allowing the use of power-efficient saturated power amplifiers.

Polar modulation offers additional benefits, such as enabling generic transmitter architectures by obviating the need for the band-pass filtering elements typically needed by conventional linear transmitter chains. Thus, polar modulation transmitters may, if properly configured, be used for a variety of modulation formats, and thereby offer the opportunity to use essentially the same transmitter architecture for GSM, EDGE, and WCDMA standards, among others.

However, as with most technical innovations, polar modulation has certain disadvantages or, more properly stated, certain limitations, that present challenges to its use. Such challenges involve the expansion of phase and amplitude bandwidths associated with "unwrapping" the phase and amplitude information. For example, the phase modulation bandwidths become fairly high, particularly in wideband systems, such as WCDMA. As such, polar modulation requirements may not be easily met with conventional phase modulation circuits, such as narrow-band Phase Locked Loops (PLLs).

Additionally, the relatively wide ranging transmit-power control required by, for example, the WCDMA standards, poses challenges to polar modulation transmitters. Further, splitting transmitter phase and amplitude information onto separate transmitter paths introduces the potential for group delay disparities between the phase and amplitude paths. In other words, timing differences in the phase and amplitude paths introduce relative time shifts between the phase and amplitude modulation information streams, resulting in potentially severe distortion in the final radio frequency (RF) transmit signal.

Such distortion may be measured in terms of an Error Vector Magnitude (EVM), which is a time domain representation of disparity between the nominal and actual transmit signal waveforms. Other parameters of interest include Adjacent Channel Power Ratio (ACPR), which is a measure of main channel power to unwanted signal spread into adjacent frequency channels. Transmit signal non-linearity gives rise to significant ACPR and thus transmitter chain linearity must be tightly controlled.

Acceptable EVM and ACPR performance depends on correct time alignment between the phase modulation and amplitude modulation envelopes within a polar modulation transmitter. For example, EDGE-based systems typically can tolerate no more than 0.1 symbols of time misalignment between the polar and amplitude modulation envelopes. No more than 0.1 "chips" of time misalignment typically can be tolerated for WCDMA-based systems. With a chipping rate of 3.84 Mega-chips-per-second (Mcps), one readily appreciates the stringency of such a requirement.

Thus, an ideal polar modulation transmitter would offer wideband signal capability. Additionally, the ideal polar modulation transmitter would include provisions for monitoring and controlling relative path delays for the amplitude and phase modulation envelopes for tight control of the transmit signal in terms of ACPR and EVM requirements, for example.

SUMMARY OF THE INVENTION

The present invention comprises a method and apparatus to improve performance in a polar modulation transmitter that generates an envelop-and-phase modulated radio frequency output signal responsive to separate envelope and phase modulation information signals. In one or more exemplary embodiments, the transmitter includes, or is otherwise associated with, a delay controller that reduces the adjacent channel power ratio (ACPR) for the transmitter's output signal by controlling a relative delay between the envelope and phase modulations imparted by the transmitter based on direct or indirect measurement of the output signal's ACPR.

An exemplary delay controller comprises an ACPR measurement circuit and an associated control circuit. The ACPR measurement circuit uses a feedback signal, which may be taken from an output signal coupler, for its ACPR measurement. It should be noted that the term "ACPR measurement" is given broad construction herein, and thus may or may not mean a literal ratio measurement. For example, in at least one embodiment, the ACPR measurement circuit generates an ACPR measurement signal based on the difference between a "main lobe" feedback signal, which corresponds to the total signal power of the feedback signal, and an "ACP" feedback signal, which largely corresponds to the adjacent channel power of the feedback signal. In other cases, the ACPR measurement may be determined as a true ratio. Regardless, the measurement circuit may be an analog measurement circuit, a digital measurement circuit, or some mix thereof.

Operating responsive to measured ACPR, the exemplary control circuit acts as a negative-feedback closed-loop controller that adjusts the relative delay between the transmitter's envelope and phase modulation operations to reduce the output signal's ACPR. As with the measurement circuit, the control circuit may be an analog circuit, a digital circuit, or some mix thereof. In an exemplary analog implementation, the control circuit generates an analog delay control signal that varies the "group delay" of a filter circuit residing in the signal path of one or the other of the input phase-modulation and input envelope-modulation information signals. By varying the filter's group delay, the control circuit can thus vary the relative timing between the input phase-modulation and envelope-modulation information streams, and thus allows the controller to adjust envelope and phase modulation synchronization for reduced ACPR.

In at least one exemplary embodiment, at least some aspects of ACPR measurement and corresponding delay control are implemented using digital logic circuits and, as such, offer the opportunity for integration of these functional aspects within a baseband processor, or other digital or mixed signal IC. In any case, with digital processing, delay control may use digital delay elements to alter the relative delay between the phase and envelope modulation information signals driving the transmitter. Indeed, the delay controller may control relative delay at the phase and envelope modulation waveform generation stage of baseband processing.

In another exemplary embodiment, a polar modulation transmitter according to the present invention further, or alternatively, provides a greatly extended transmit power control range through the use of a "staged amplifier" circuit that includes a saturated driver amplifier circuit that operates in concert with a power amplifier circuit. With this type of circuit, the transmitter offers exceptional dynamic range for transmit power control, and thus meets the mobile station power control requirements of, for example, the WCDMA standards.

An exemplary implementation of the transmitter according to this embodiment includes a power controller that generates scaled envelope modulation signals from the input envelope-modulation information signal. Such scaling is based on an input power control signal that corresponds to a desired transmit power level. One such scaled signal serves as a "tail current" modulation signal for exemplary differential transistor pairs in the driver amplifier circuit. An additional scaled signal drives a power amplifier controller, which provides a modulated supply signal to the power amplifier circuit. Such supply signal modulation may be voltage-mode, current-mode, or some combination thereof.

A phase modulator included in the transmitter generates a phase-modulated signal responsive to the input phase-modulation information signal. That phase-modulated signal is coupled to an input of the driver amplifier circuit, while the output of the driver amplifier circuit is coupled to an input of the power amplifier circuit. When operated in tandem, that is, with their envelope modulation operations synchronized, the driver amplifier circuit and the power amplifier circuit operate simultaneously to impart envelope modulation to the phase-modulated signal responsive to the scaled envelope modulation signals. Scaling of the scaled envelope modulation signals provides the desired transmit power control. Thus, this "staged amplifier" circuit provides both extended range transmit power control and envelope modulation.

Further, in one or more exemplary embodiments of the transmitter, the stage amplifier circuit is operated in a first mode where the driver amplifier circuit passes through the phase-modulated signal for envelope modulation by the power amplifier circuit and, in a second mode, operates in concert with the power amplifier circuit as just described. For example, for a first range of transmit power control, the driver amplifier circuit may be operated in pass-through mode by holding the scaled envelope modulations signals provided to it at some steady state value. Thus, the phase-modulated signal is passed through the driver amplifier circuit and envelope modulated only at the power amplifier circuit. Then, for a second, greater range of power control, the driver amplifier may be operated in concert with the power amplifier by controlling the scaled envelope modulation signals for both the driver amplifier and power amplifier responsive to the input envelope-modulation information signal, scaled according to the desired transmit power level.

An exemplary driver amplifier circuit is implemented as a fully-saturated differential transistor pair and, as such, is well suited for implementation within a transmitter or transceiver integrated circuit (IC) device, yet its envelope modulation operations remain synchronized with those of the power amplifier circuit, which generally is not integrated into any such transmitter IC because of its higher power, and because the transistor devices used in typical power amplifiers generally are not suited for implementation in a typical IC.

Of course, the present invention allows implementation variation as needed or desired, as will be apparent to those skilled upon reading the following description of exemplary operation and implementation, and upon viewing the accompanying drawings. However, it should be understood that the present invention is not limited by the following discussion of exemplary embodiments.

DETAILED DESCRIPTION OF THE INVENTION

Figure 1:
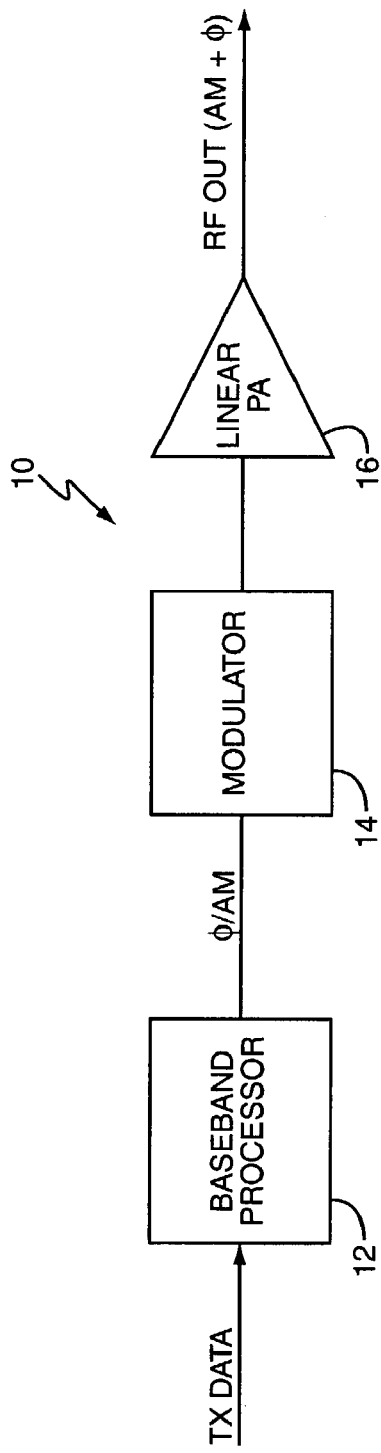
FIG. 1 is a diagram of a typical linear transmitter.

FIG. 1 illustrates a typical linear transmitter 10 for use in a wireless communication device or system. Transmitter 10 comprises, in this simplified depiction, a baseband processor 12, a modulator 14, and a linear power amplifier 16. Desired transmit data, such as a digital bit stream of channel-encoded transmit data is converted into a corresponding stream of modulation symbols including both phase and amplitude modulations by the baseband processor 12. These modulation symbols drive the modulator 14, which imparts corresponding phase and amplitude modulation to a RF carrier frequency signal (not shown). The modulated carrier signal output from modulator 14 serves as an input signal to the linear power amplifier 16, which generates a corresponding RF output signal having both phase and linear amplitude modulations and suitable for transmission via an associated antenna assembly (not shown).

Key to its acceptable performance, the linear power amplifier 16 must impart linear envelope modulations corresponding to the amplitude variations in the modulated carrier signal. Non-linearity in its operation causes the linear power amplifier 16 to introduce unwanted frequency harmonics and other distortion components in the RF output signal, which causes undesirable spectral spreading of that signal into adjacent channel frequencies. Of course, those skilled in the art will appreciate that means for biasing and maintaining linear power amplifier 16 at a suitable linear operating point are known, yet such means do not solve the power inefficiencies attendant to such linear operation.

Figure 2:
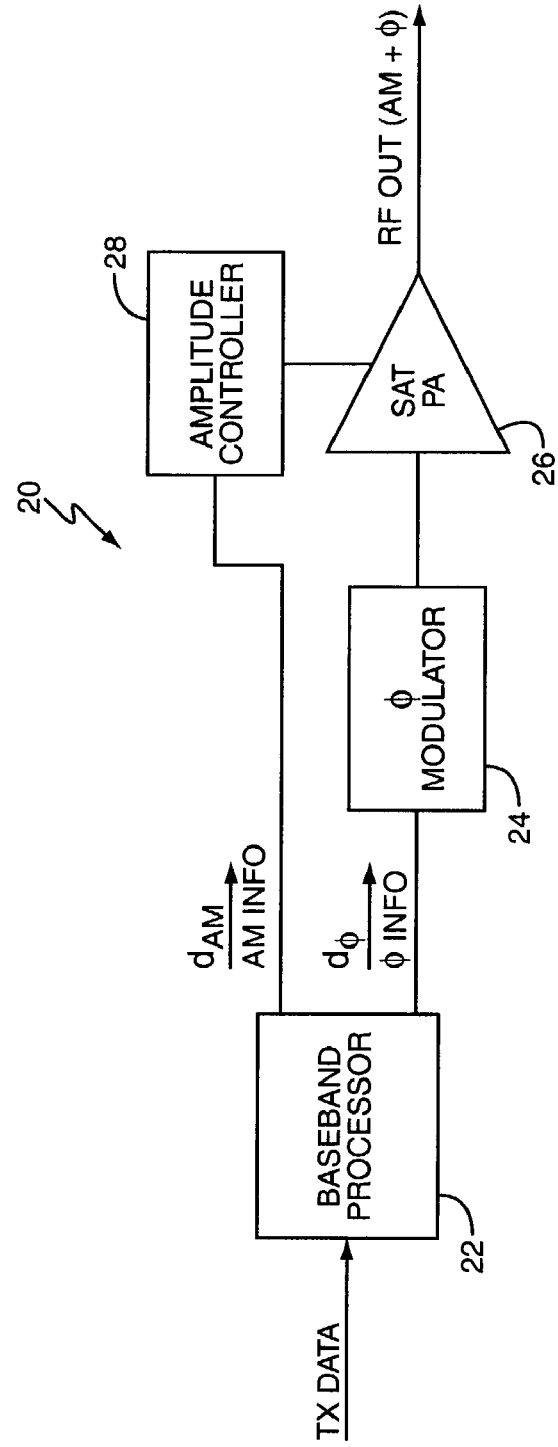
FIG. 2 is a diagram of a typical polar modulation transmitter.

The amplifier circuit of FIG. 2 offers a known, typical alternative to the linear amplifier arrangement of FIG. 1. In the illustrated circuit, a baseband processor 22 "unwraps" the transmit data information stream into separate but temporally synchronized phase and amplitude modulation information streams. The phase modulation information signal drives a phase-modulator 24, which generates a constant-envelope but phase-modulated output signal that serves as an input to a saturated-mode power amplifier circuit 26. Operation of the amplifier circuit 26 in the saturated mode allows for power-efficient operation as compared to the linear amplifier 16 of FIG. 1, while still allowing for linear amplitude modulation of the resultant RF output signal based on modulating the supply signal that powers saturated amplifier 26.

That is, the RF output signal generated by saturated amplifier 26 includes phase modulations corresponding to the phase-modulated but constant-envelope carrier signal output by phase modulator 24 and envelope modulations corresponding to the modulated supply signal output by an amplitude controller 28. By driving the amplitude controller with the desired amplitude modulation information signal, the RF output signal includes the phase and amplitude modulation information corresponding to the desired transmit information stream.

While polar modulation as typified by the circuit of FIG. 2 offers significant advantages in terms of power efficiency, it may be problematic where wide dynamic range is required for transmit signal power control. Further, because polar modulation separates the phase and amplitude information into separate signal streams processed on separate phase and amplitude signal modulation paths, respectively, timing errors may arise. In other words, amplitude and phase modulations in the RF output signal must be synchronized to maintain the relative timing between the unwrapped phase and amplitude information streams. Any differences in the "group delay" between the phase modulation signal path and the amplitude modulation signal path can cause potentially severe distortion in the RF output signal.

Figure 3:
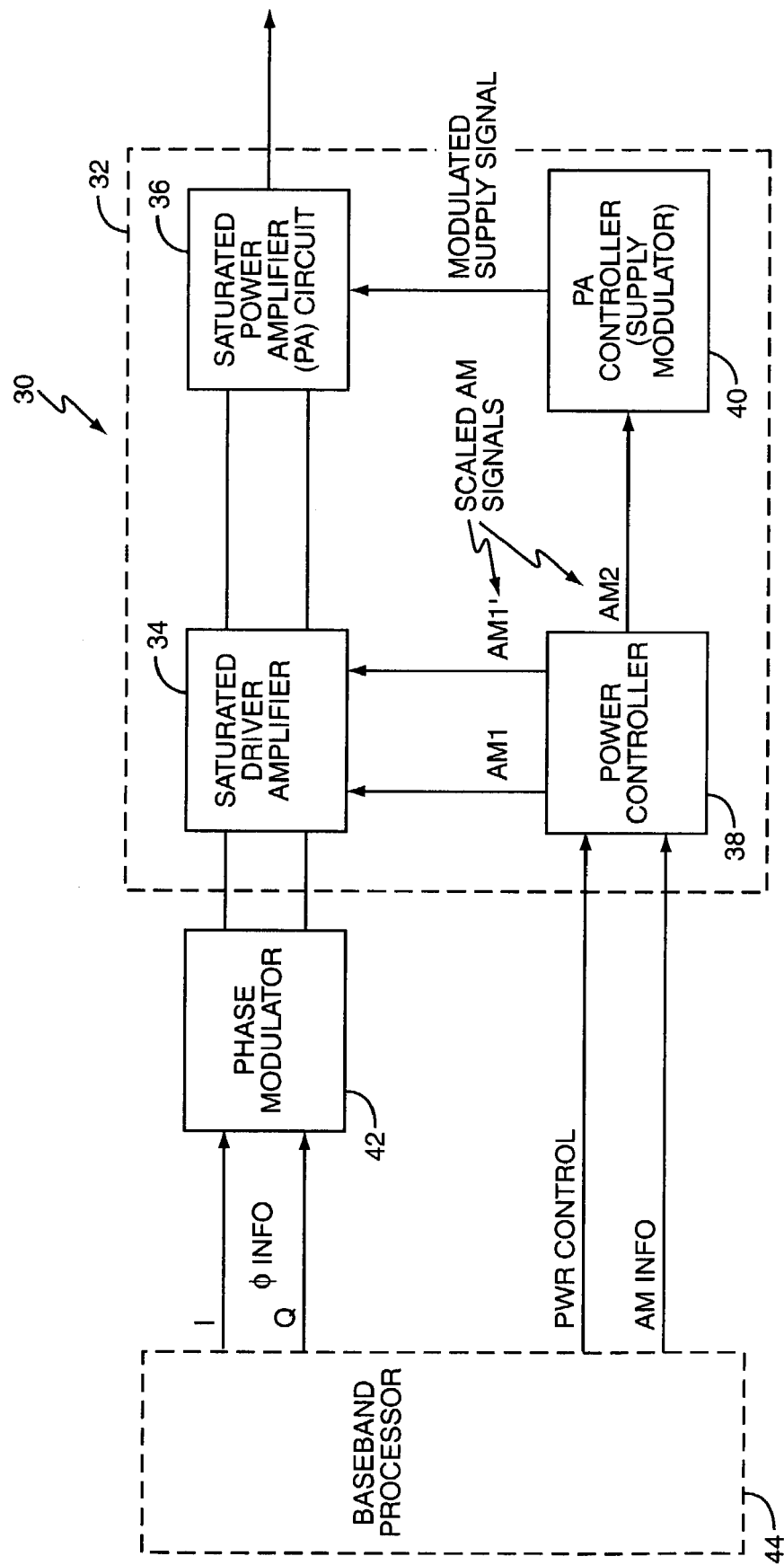
FIG. 3 is a diagram of an exemplary transmitter circuit embodying polar modulation according to the present invention.

FIG. 3 illustrates an exemplary embodiment of a polar modulation transmitter 30 according to the present invention, which includes staged amplifier circuits 32, including a saturated driver amplifier 34, a saturated power amplifier (PA) circuit 36, a power controller 38, and a power amplifier (PA) controller 40, and which transmitter further includes a phase modulator 42. It should be noted that one or more of these circuit blocks may be integrated together, such as in a RF transceiver integrated circuit (IC).

In operation, the transmitter 30 receives an input phase modulation information signal, an input amplitude modulation information signal, and an input power control information signal from a baseband processor 44, for example. The baseband processor 44 may include digital-to-analog converters (DACs) as needed to provide the phase and amplitude information signals to the transmitter 30 in analog format, or the transmitter 30 may receive signals from the baseband processor 44 in digital format and convert them as needed or desired. Indeed, the signal types of interest may be analog, digital, or a mix thereof.

As shown, the input phase modulation information may be quadrature (I and Q) information streams that drive phase modulator 42, which generates a phase-modulated signal at a desired carrier frequency, $f_c$, responsive to the input phase modulation information signals from baseband processor 44. In this exemplary embodiment, the phase-modulated signal output from phase modulator 42 is a constant-envelope quadrature signal, i.e., an in-phase signal plus a quadrature signal. Of course, those skilled in the art will appreciate that such arrangements can be altered as needed or desired for any given modulation format.

Regardless, transmitter 30 generates an output signal, RFOUT, that includes both phase and envelope modulations corresponding to the input phase-modulation and envelope-modulation information signals, and at a desired transmit power level as controlled by the input power control signal. The phase modulator 42 generates a phase-modulated signal responsive to the input phase-modulation information signal, and the driver amplifier circuit 34 and the PA circuit 36 operate in tandem to impart envelope modulation to the phase-modulated signal output from phase modulator 42 responsive to the input envelope-modulation information signal.

More particularly, the power controller 38 generates scaled versions of the input envelope-modulation information signal based on the desired transmit power. A first scaled envelope modulation signal-which may be generated as a signal pair, AM1 and AM1'—controls the envelope modulation imparted by the driver amplifier circuit 34, while a second scaled envelope-modulation signal, AM2, controls the envelope modulation imparted by the PA circuit 36. Specifically, in this embodiment, the second scaled envelope modulation signal controls the amplitude modulation imparted to the power amplifier circuit's input supply signal by the PA controller 40.

In at least one embodiment, the transmitter 30 may be operated in first and second modes, wherein in the first mode, the driver amplifier circuit 34 is operated in a pass-through mode by holding the AM1 signal(s) in a steady state, i.e., by not modulating AM1 and AM1' responsive to the input envelope-modulation information signal. In this mode, the phase-modulated signal passes through driver amplifier circuit 34 and into PA circuit 36, where the desired envelope modulation is imparted by controlling the second scaled envelope modulation signal, AM2, responsive to the input envelope-modulation information signal, and wherein the power controller 38 scales AM2 based on the desired transmit power.

The first or "pass-through" mode of transmitter operation permits transmit power control within a first range of transmit power levels. To extend that range, the second mode of transmitter operation controls the driver amplifier circuit 34 and the power amplifier circuit in tandem such that the combination of the two circuits functions as a staged amplifier circuit that provides an extended transmit power control range for the output signal. In this second mode, the driver amplifier circuit 34 and the PA circuit 36 impart simultaneous, synchronized envelope modulations to the phase-modulated signal. Of course, those skilled in the art will recognize that selective operation is not required, and that the envelope modulation contributions of the driver amplifier circuit 34 and the PA circuit 36 may be scaled independently using the AM1 and AM2 signals, such that the envelope modulation contribution of either or both circuits is varied as needed or desired.

In an exemplary embodiment, one might hold the driver amplifier circuit 34 in pass-through mode, and therefore control the transmit power level of the transmitter's output signal based on appropriately scaling the envelope modulations imparted by PA circuit 36 via the signal AM2. Such operation might correspond to GSM/EDGE signal transmissions, or to a first part of a WCDMA transmission power control range. If additional dynamic range is required, such as for a remaining portion of the WCDMA transmit power control range, the transmitter 30 would then "activate" the driver amplifier 34 to extend the power control range as needed. Such operation is particularly advantageous in a cellular telephone that operates in WCDMA networks or in both WCDMA and GSM/EDGE networks.

Supporting such operation, the power controller 38 generates the "scaled" amplitude modulation signals (e.g., AM1/AM1 and AM2) responsive to a power control input signal and an amplitude modulation input signal received from the baseband processor 44. As used herein, references to AM1 should be understood to include AM1 and AM1' unless otherwise noted. For example, the current transmit power requirements as indicated by the power control input signal might be such that the power controller 38 sets AM1 to a steady-state value (a dc value), which holds the driver amplifier 34 in its "pass-through" mode. With AM1 at steady state, the power controller 38 would then generate AM2 by scaling the AM input signal according to the power control signal. In turn, the PA controller 40 envelope-modulates the supply signal of PA 36 responsive to AM2, such that the output signal from PA 36 is generated at the desired transmit power level and has combined envelope and phase modulation information.

If additional power control is needed, the power controller 38 generates AM1 as a scaled amplitude modulation signal in synchronization with AM2, such that driver amplifier 34 and PA 36 apply coordinated, simultaneous envelope modulation. Note that the scaling used to obtain AM1 may be different than the scaling used for AM2. Thus, for a given power control input signal value, the relative scaled amplitudes of AM1/AM1' may well be different than that of AM2. In an exemplary embodiment, the power control input signal is a digital control word from the baseband processor 44 and power controller 38 sets is signal scaling based on the value of that control word. However, the power control input signal may be analog, such that the power controller 38 applies proportional scaling as a function of the analog signal value. Regardless, the power controller 38 may, if desired, be pre-configured with scaling factors nominally corresponding to different transmit power levels.

Figure 4:
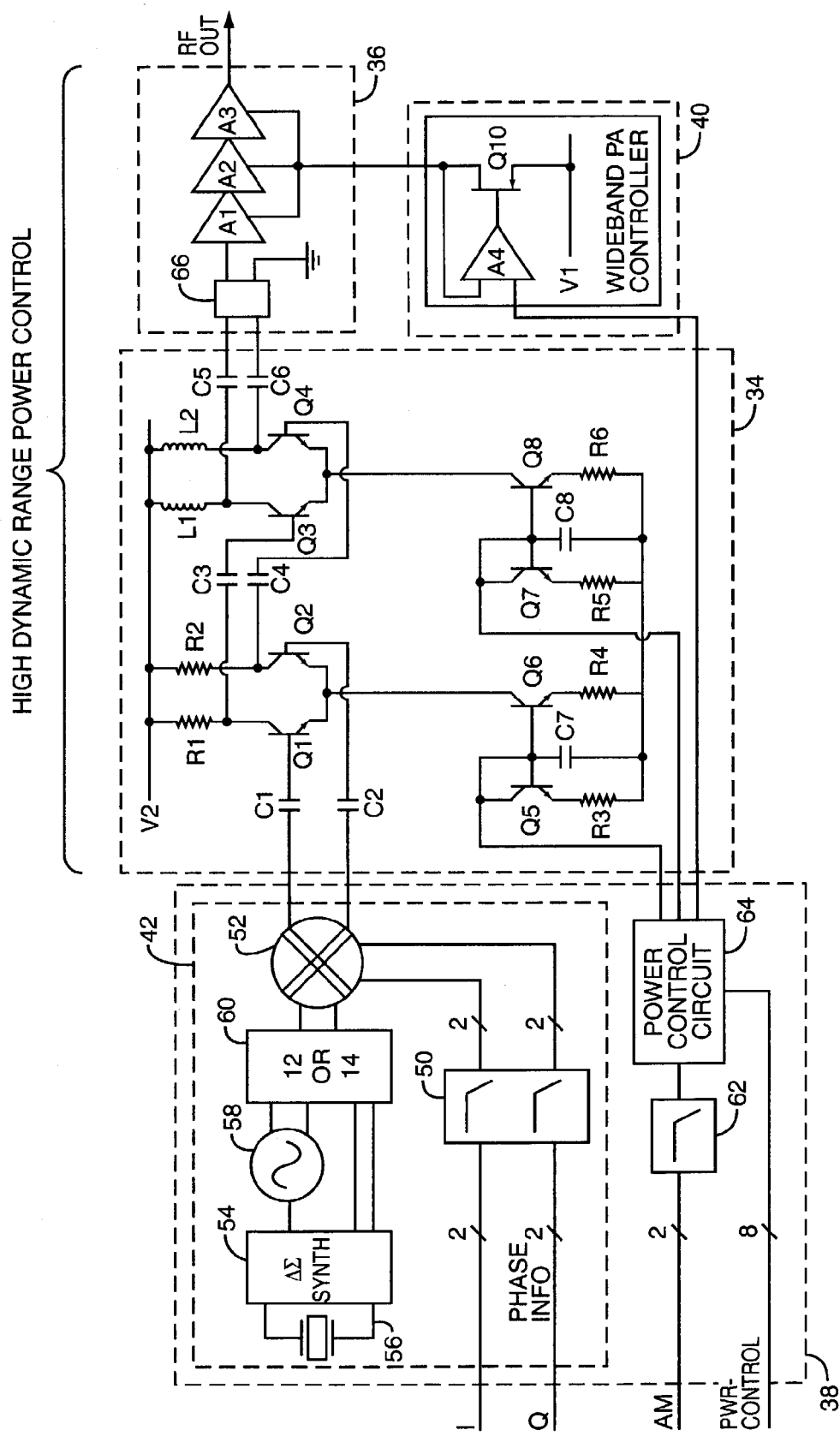
FIG. 4 is a diagram of exemplary details for the transmitter circuit of FIG. 3.

FIG. 4 illustrates exemplary details for the transmitter 30 of FIG. 3, and offers a basis for further describing exemplary operation. The exemplary phase modulator 42 offers significantly enhanced wideband phase modulation performance, with a PLL bandwidth sufficient to prevent so-called "VCO pulling." Phase modulator 42 comprises input filter 50, quadrature modulator 52, a frequency synthesizer 54, a stable clock reference 56, a Voltage Controlled Oscillator (VCO) 58, a fractional divider circuit and a fractional divider circuit 60.

In operation, the frequency synthesizer 54, which may be, for example, a Sigma-Delta converter, operates at several times the desired transmit frequency. For example, frequency synthesizer 54, which may be adjustable for frequency-channel stepping, operates in the range of about 4 GHz. As such, VCO 58 is driven at a multiple of the desired transmit frequency, which may be in the range of about 1 GHz or about 2 GHz. Therefore, fractional divider 60, which may be, for example, a÷2 or a÷4 frequency divider, is used to provide quadrature oscillation signals to quadrature modulator 52. It should be noted that other converter types (non Sigma-Delta) may be used as needed or desired. Indeed, the phase modulator 42 as a whole may be varied as needed or desired.

Modulator 52 thus modulates the oscillation signals input to it from frequency divider 60 according to the input phase modulation information represented by the quadrature phase modulation signals passed through input filter 50. Quadrature modulator 52 thus generates quadrature phase-modulated signals, which are collectively referred to as a phase-modulated signal, and which are input to the driver amplifier 34.

An exemplary driver amplifier 34 comprises, as shown, a differential pair transistor circuit with "tail current" modulation. With this configuration, driver amplifier 34 operates in a saturated mode but imparts linear amplitude modulation to the input signals proportional to the tail currents, which are set by the power controller 38 via the AM1/AM1' signals. As noted, these envelope modulations are imparted in synchronization with the PA 36 such that the driver amplifier 34 and the PA 36 operate in concert as a staged envelope modulator.

As noted, the illustrated arrangement allows the driver amplifier 34 to operate in saturated mode, wherein the transistor pairs Q1/Q2 and Q3/Q4 are operated as fully-switched transistor stages used to impart linear envelope modulation responsive to AM1/AM1'. Further, as noted earlier, holding AM1/AM1' at an appropriate steady-state value places the driver amplifier 34 into a pass-through or inactive mode, such that driver circuit passes through the I/Q phase modulated output signal from phase modulator 42 to the PA 36 without imparting any envelope modulation. Note that whether or note the driver amplifier 34 is operated in pass-through or active modes, its output may comprise an output signal pair taken from the collectors of transistors Q3 and Q4 as coupled through capacitors C5 and C6. Where such quadrature signals are used, the PA circuit 36 may include an input coupler 66 to convert the phase-modulated signal into a combined single-ended signal.

Further, those skilled in the art should appreciate that the transistor circuits comprising transistors Q1 through Q8, along with their supporting circuit elements, are exemplary and may be varied as needed or desired. Regardless of the implementation details, the exemplary driver amplifier 34 generally is suitable for implementation as part of a transmitter or transceiver IC. That is, by using the type of electronic devices commonly available in the "device libraries" for mixed signal semiconductor processes, the driver amplifier 34 advantageously integrated into a transceiver IC and used to drive the PA 36 which, because of its higher power requirements and device sizes, commonly is implemented separately from the transceiver IC. Thus, the present invention contemplates a pre-PA driver circuit, i.e., the driver amplifier 34, that is readily integrated into transmitter/transceiver ICs and that selectively provides amplitude modulation coordinated with the PA 36 as needed or desired.

The exemplary saturated PA circuit 36 comprises a multistage amplifier circuit, e.g., series amplifiers A1, A2 and A3, configured for saturated mode operation. However, it should be noted that the operating bias points might be adjusted separately for each of the staged amplifiers in the series chain. In any case, the power amplifiers comprising PA 36 impart envelope modulation responsive to a modulated supply signal output from the PA controller 40. It should be noted that the circuit comprising PA 36 may include, for example, coupler 66 to convert the quadrature signals output by driver amplifier 34 into a combined single-ended signal for input to the first amplifier stage of PA 36.

The PA controller 40 may operate as a "$V_{DD}$" modulator, i.e., a supply voltage modulator, as an "$I_{DD}$" modulator, i.e., supply current modulator, or as some combination thereof. In any case, the envelope modulation embodied in the modulated supply signal provided by PA controller 40 is a function of the amplitude modulation output by the baseband processor 44 but scaled according to operation of the power controller 38.

The power controller 38, which in an exemplary embodiment includes an AM signal input filter 62, such as a pulse shaping filter, and a control circuit 64 coupled thereto, generates the scaled envelope modulation signal, AM2, for the PA controller 40 as a function of the desired amplitude modulation information and the desired transmit signal power level. The control circuit 64 thus receives a filtered version of the amplitude modulation information signal for generating the scaled envelope modulation signals according to the value of the input power control signal. As noted, all such input signals may be generated by or otherwise provided by the baseband controller 44.

While details of the PA controller 40 are not necessary for understanding the present invention, as those skilled in the art readily understand the various circuit implementations that may be used to impart supply voltage and/or supply current modulation to the power supply signal provided by controller 38 to the saturated PA circuit 36. Nonetheless, exemplary details for novel implementations of such circuits may be obtained from the following co-pending and commonly assigned U.S. patent applications:

(1) "SYSTEM AND METHOD FOR CURRENT-MODE AMPLITUDE MODULATION," filed on Mar. 21, 2001, and assigned Ser. No. 09/813,593; and (2) "SYSTEM AND METHOD FOR RF SIGNAL AMPLIFICATION," filed on Mar. 21, 2001, and assigned Ser. No. 09/813,741.

Both of the above applications are incorporated herein by reference.

Figure 5:
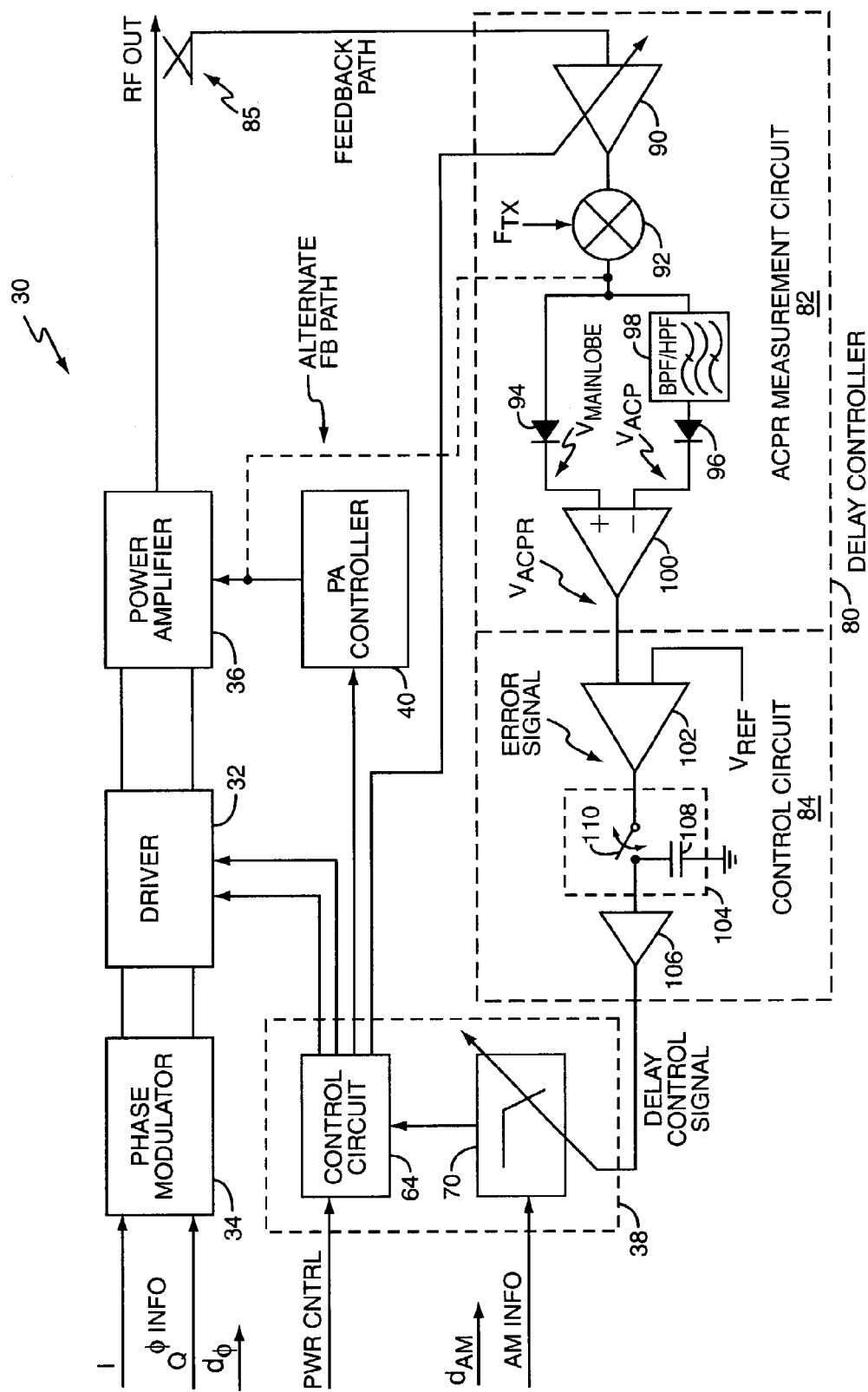
FIG. 5 is a diagram of an exemplary transmitter circuit including a delay controller.

In addition to the wide dynamic range transmit power control afforded by the exemplary transmitter 30 detailed above, the present invention contemplates additional or alternate polar modulation performance improvements through controlling the relative delays of the phase and amplitude modulations in the RF output signal relative to the corresponding synchronized input phase and amplitude modulation information streams. Thus, in an exemplary alternate embodiment depicted in FIG. 5, the transmitter 30 includes a delay controller 80 to minimize or otherwise reduce group delay differences between the phase and amplitude modulations imparted by the transmitter 30. With delay controller 80, the relative delay between the phase modulations imparted by the phase modulation signal path of transmitter 30 and the envelope modulations imparted by the envelope modulation signal path is controlled to ensure that the phase and envelope modulations appearing in the transmitter's output signal, RFOUT, maintain the same relative timing as the phase and envelope modulations in the input phase and amplitude modulation information signals.

Broadly, the transmitter 30 operates as a polar modulation transmitter with automatic phase and/or amplitude modulation group delay calibration that is based on real-time ACP measurement. That is, according to one or more exemplary embodiments, the transmitter 30 provides or otherwise enables real-time control of the relative delay difference between the separate amplitude and phase modulations imparted by transmitter 30 to minimize or otherwise reduce undesirable signal distortions in the transmitter's output signal, RFOUT. Those skilled in the art will immediately appreciate that this functionality addresses one of the primary disadvantages of polar transmission wherein the phase and amplitude modulation information follows different signal paths and thus, almost unavoidably, suffers from differences in their group delay.

The exemplary delay controller 80 operates as a feedback control circuit that adjusts the group delay of the input amplitude modulation information. While the illustrated delay control is applied to the amplitude modulation signal path, it should be understood that the group delay control can be applied to the phase modulation signal path. Regardless, the delay controller 80 ensures that relative phase and amplitude timing in the RF output signal from transmitter 30 corresponds to the relative phase and amplitude timing of the input phase and amplitude modulation information streams output from the baseband controller 44. By thus controlling phase and amplitude modulation misalignment, the transmitter 30 exhibits outstanding transmit signal characteristics, including favorable ACPR and EVM parameters.

As illustrated, an exemplary delay controller 80 comprises an ACPR measurement circuit 82, and a control circuit 84. The ACPR measurement circuit 80 provides real-time measurement of ACPR in the transmitter's output signal, RFOUT, based on direct feedback from the output signal, or based on indirect feedback from the modulated supply signal generated by PA controller 40. Regardless, the measurement circuit 82 provides an output signal, the ACPR measurement signal, that is proportional to, or otherwise indicative of, the ACPR in the transmitter's output signal, RFOUT.

In an exemplary embodiment, the measurement circuit 82 comprises an output coupler 85 (if feedback is taken from the transmitter's output), a variable-gain-amplifier (VGA) 90, a downconverter 92, envelope detectors 94 and 96, band-pass or high-pass filter 98, and differential amplifier circuit 100. In operation, the VGA 90 provides the downconverter 92 with a substantially constant input signal level by varying the feedback signal gain inversely with respect to output power. Thus, in an exemplary embodiment, the power controller 38 generates a VGA control signal that varies in inverse proportion to the desired transmit signal power level such that the gain of VGA 90 decreases with increasing signal power and vice versa.

Figure 6:
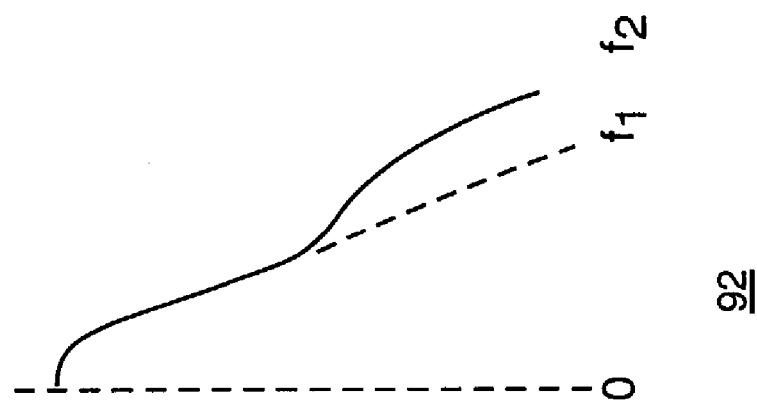
FIG. 6 is a diagram of exemplary ACP measurement circuit operation.
Figure 6:
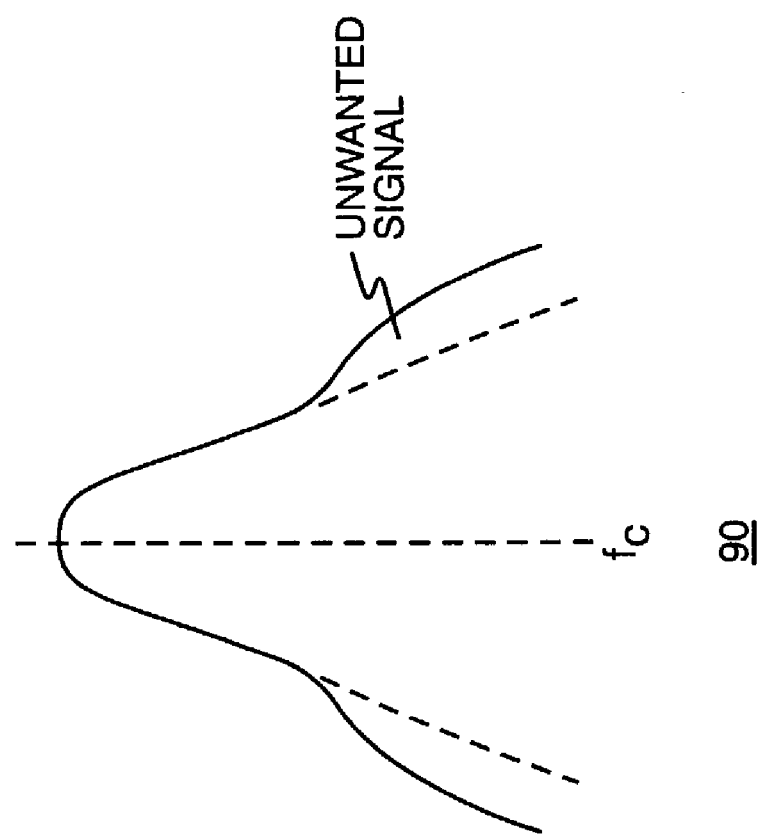

FIG. 6 illustrates operation of the exemplary measurement circuit 82. As illustrated, the frequency envelope of the transmitter's output signal is expanded by unwanted frequency components arising from, among other things, group delay differences between the phase and amplitude modulation timing in transmitter 30. The output signal from VGA 90 reflects this undesirable frequency spreading. Thus, the output signal from downconverter 92 is a baseband signal having the majority of its signal power contained in signal components having a nominal frequency, $f_1$, that corresponds to nominal bandwidth of the transmitter's current transmit frequency channel assignment, and additional signal power in signal components at higher frequencies, e.g., up to $f_2$, that correspond to unwanted adjacent channel interference, i.e., signal frequencies that extend into adjacent channel frequencies.

By subjecting the output signal from downconverter 92 to high-pass filtering via filter 98, envelope detector 96 receives the higher frequency signal components of the baseband signal that correspond to ACP in the transmitter's output signal. As envelope detector 94 receives the full baseband signal, VMAINLOBE, the differential amplifier 100 generates its output signal, VACPR, as function of VMAINLOBE–VACP. In other words, the VACPR is proportional to the adjacent channel power ratio of the transmitter's output signal, RFOUT.

While such operation illustrates an advantageous approach to generating an output signal that is proportional to the actual ACPR of the transmitter's output signal using an easily implemented differencing circuit, those skilled in the art will appreciate that real-time ACPR measurement may be based on a variety of circuit implementations. Thus, the present invention may be practiced using other ACPR measurement circuit implementations.

The output signal VACPR from the measurement circuit 82 serves as an input to the control circuit 84, which, in an exemplary embodiment, comprises amplifier 102, memory element 104, output buffer amplifier 106, and a controlled switching element 110. In operation, the control circuit 84 generates a delay control signal responsive to the VACPR signal from the measurement circuit 82.

In the illustrated embodiment, the delay control signal is an analog control signal that adjusts a tunable filter 70 used by power controller 38 in filtering the AM input signal from baseband processor 44. More specifically, an exemplary power controller 38 comprises a control circuit 64 and an adjustable-delay filter 70. Filter 70 may be implemented as a four-pole Sallen Key filter, for example, but it should be understood that the present invention is not dependent on the filter details. For this embodiment, it is enough that filter 70 is in some way adjustable, such that its group delay characteristics change in response to the changing delay control signal output by delay controller 80.

Generally, then, an exemplary filter 70 includes one or more tunable elements, such as variable resistors and/or capacitors, such that the group delay of filter 70 may be changed by adjusting the filter bandwidth. It should be noted that the required adjustments in delay variation will vary depending upon the particular application, but generally the required adjustment range is quite small, such as fractions of a microsecond in the case of WCDMA with its 3.84 Mcps rate. In any case, by controlling the group delay of filter 70, delay controller 80 provides closed-loop feedback control of the relative delay between the phase group delay, $d_\theta$, and the amplitude group delay, $d_{AM}$, transmitter 30.

In looking at an exemplary control circuit 84 in more detail, one sees that amplifier 102 generates an error signal based on the difference between the VACPR signal as output from measurement circuit 82 and a reference signal, which may be provided by the baseband processor 44, for example. In an exemplary embodiment, the baseband processor 44 may be configured with, for example, a lookup table containing stored values corresponding to reference signal values for various operating conditions. For example, the transmitter 30 could be characterized over temperature to obtain nominal reference values over a desired temperature range corresponding to minimal ACPR. Thus, the baseband processor 44 could access stored data to obtain a particular reference value, which could then be converted into an analog voltage for input to amplifier 102.

Amplifier 102 generates its output signal as an error signal that generally reflects timing misalignment between the amplitude and phase modulations, as manifested by increased ACPR, and thus serves as a negative feedback control signal that may be used to adjust the group delay of one or both the amplitude and phase information signal paths in transmitter 30 to reduce such misalignment. Because of the real-time ACPR measurement provided by measurement circuit 82, the delay controller 80 may implement a short delay calibration function at the beginning of a given transmission sequence, periodically based on a determined timing period, or on an as-needed basis.

With its delay calibration operation, the control circuit 84 connects memory element 104 to the output of amplifier 102, such that error signal is applied to the memory element 104—shown here as a capacitor. Thus, the output buffer 106 generates the delay control signal as a buffered version of the error signal. While in this "calibration mode," the delay controller 80 uses feedback to actively adjust the relative difference between the phase and amplitude modulation group delays to minimize ACPR as measured by measurement circuit 82. Such calibration might be performed, as noted, at the beginning portion of a given transmission, or according to some defined interval, which might be set as a function of the voltage droop characteristics of the capacitor used to implement memory element 104.

Of course, any such time interval may be adjusted to compensate for temperature, or the capacitor voltage droop may be profiled for temperature and such profile information stored for use by baseband processor 44 and/or power controller 38 for timing control of switch 110. Also, the delay controller 80 may be implemented such that memory element 104 is "pre-loaded" with a default or initial control value, or otherwise configured such that the delay control signal can be set to or held at a desired value independent of the feedback.

In any case, the delay control signal may thus be driven to a desired level during active calibration (feedback) and then held there by operation of the memory circuit 104 and the switch 110. In that sense, the delay control signal may be generated as a "track-and-hold" signal. Those skilled in the art will recognize that capacitor 108 may be selected to have a relatively low leakage, which yields favorable droop characteristics and that, likewise, switch 110 may be a low-leakage transistor-based circuit that provides high isolation for capacitor 108 when switch 110 is open. Other considerations would be the input leakage of buffer amplifier 106 and the "drive" capability of error amplifier 102, which preferably has enough output current sourcing capability to quickly charge capacitor 108 during the active feedback portion of delay calibration.

Figure 7:
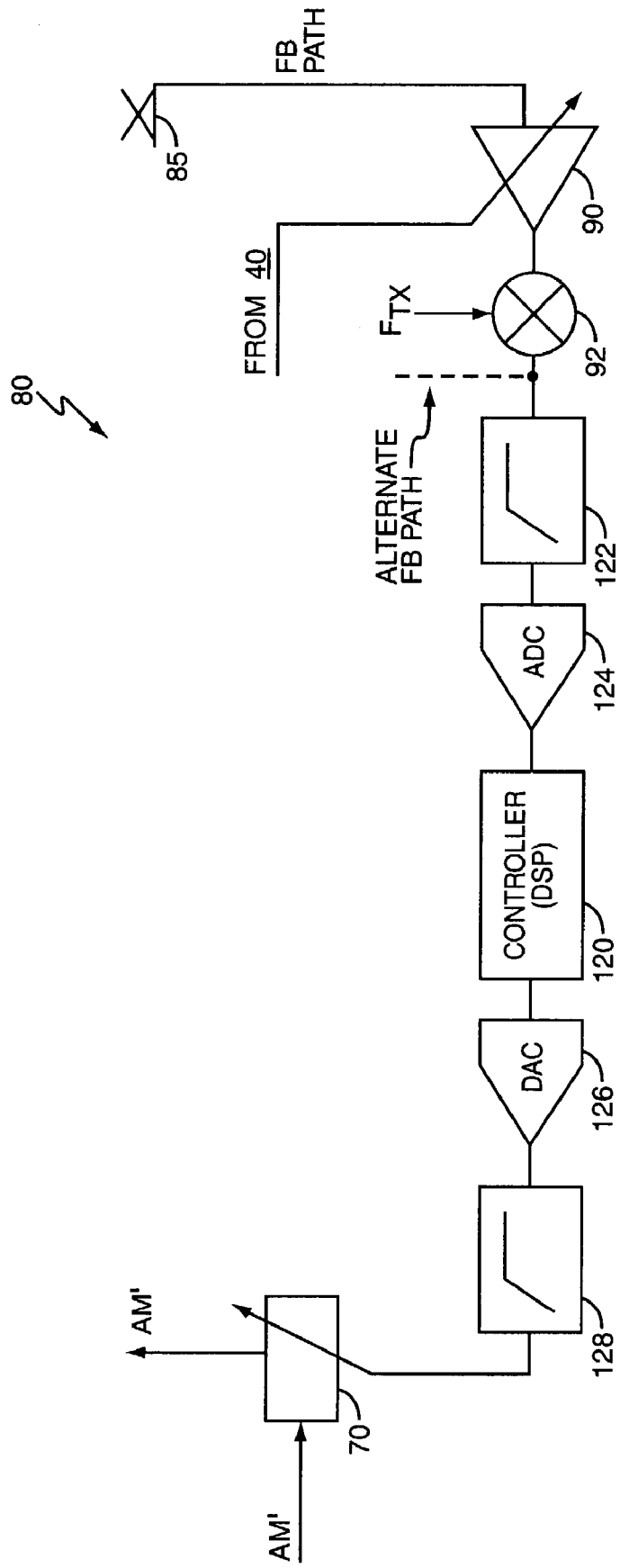
FIG. 7 is a diagram of an alternate exemplary delay controller embodiment.

FIG. 7 illustrates an exemplary alternate embodiment of the delay controller 80, wherein at least some delay control processing occurs in the digital domain. Thus, the feedback signal obtained from coupler 85 or from the output of the amplitude modulation controller 38 may be filtered by filter 122 before input to Analog-to-Digital-Converter (ADC) 124 for conversion to the digital domain. A signal processor 120 (e.g., a Digital Signal Processor or other digital logic circuit) processes the digitized feedback signal to obtain an ACPR measurement signal and generate a digital delay control signal therefrom. Those skilled in the art will immediately recognize the opportunity for sophisticated processing of the feedback signal, including enhanced error monitoring through extracting higher order signal quality parameters from the feedback monitoring signal, or simply from using more sophisticated envelope detection algorithms, such as by the use of digital filtering.

In any case, a Digital-to-Analog-Converter (DAC) 126 and output filter 128 may be used to convert the digital delay control signal into analog form for use in tuning the adjustable delay filter 70. Of course, power controller 38 may be configured to receive the digital format delay control signal directly. Further, it should be understood that circuit implementation details, such as whether a "multiplying" (current mode) DAC or a voltage-mode DAC is used for DAC 126 depends on the configuration of adjustable delay filter 70, and may be changed as needed or desired.

Figure 8:
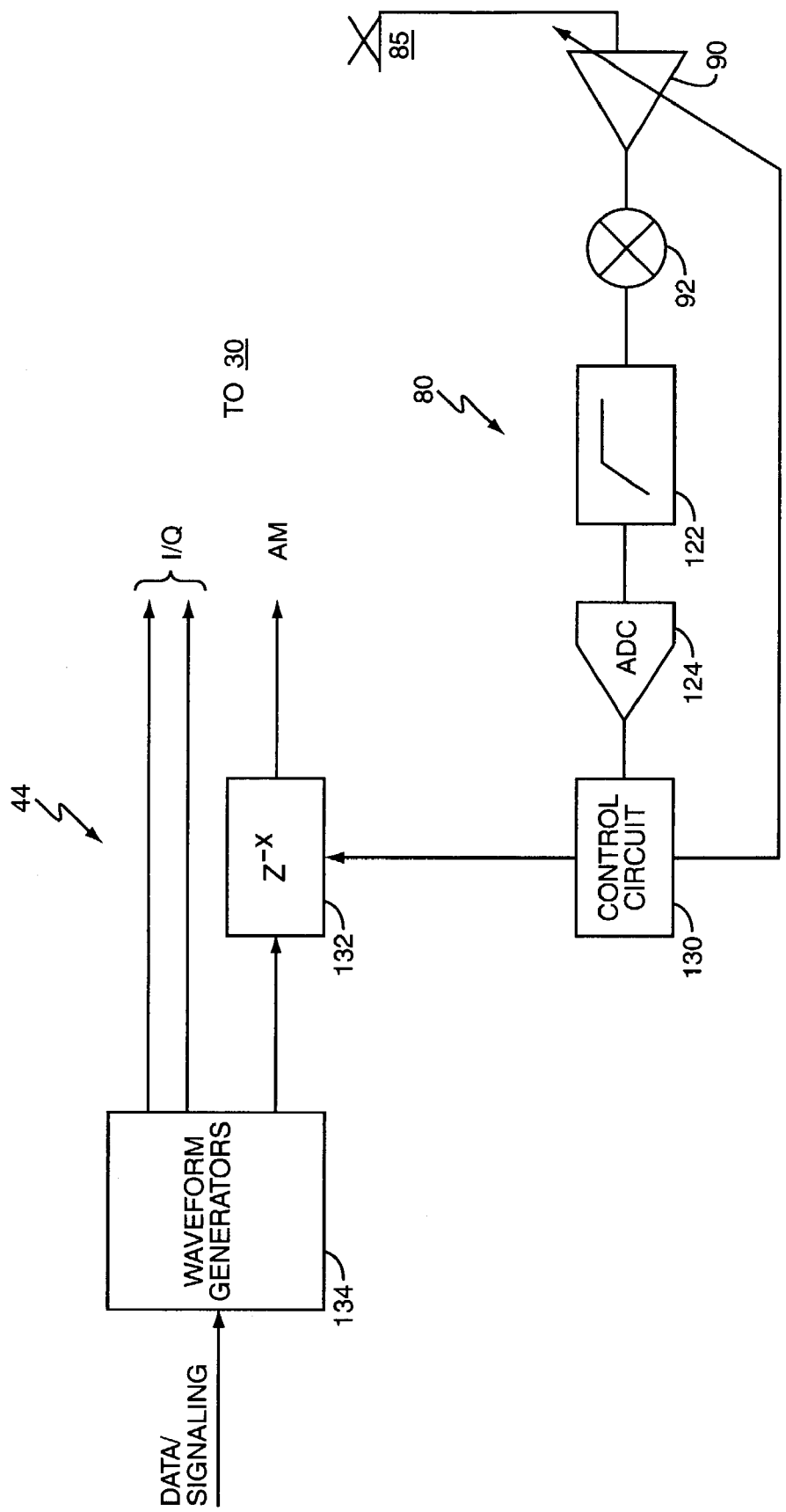
FIG. 8 is a diagram of another alternate exemplary delay controller embodiment.

Further illustrating its implementation flexibility, FIG. 8 illustrates another exemplary embodiment of the present invention wherein real-time measurement of ACPR is used to control the relative phase/AM group delay at the digital waveform generation stage. For example, at least a portion of real-time ACPR measurement and corresponding digital delay control may be incorporated into the logic circuits of baseband processor 44 (or may be implemented in the digital circuits of a RF transceiver IC). In any case, one of the advantages of this particular embodiment is that the feedback signal is digitized for determination of ACPR and subsequent generation of the delay control signal all in the digital domain.

More particularly, the feedback signal taken from, for example, coupler 85, as before, is gain-controlled, downconverted, filtered and digitized using VGA 90, downconverter 92, filter 122, and ADC 124. Note that filter 122 generally is set at some higher bandwidth than the downconverted ACPR-related signal frequencies and thus serves as an anti-aliasing filter. Further, note that VGA 90 may be eliminated if downconverter 92 and ADC 124 are compatible with the expected dynamic range of the feedback signal—this optional component omission also applies to the earlier analog embodiments of delay controller 80.

In any case, a control circuit 130, which may be implemented as part of baseband processor 44, receives the digitized feedback signal from ADC 124, and performs filtering and differencing, or other signal processing operations, to obtain an ACPR measurement. From this ACPR measurement, control circuit 130 adjusts the digital delay of delay element 132, which controls the group delay of the AM waveform. Note that the phase and AM waveforms from waveform generator 134 may be converted to analog outputs before outputting them to the transmitter 30.

One of the obvious advantages to the embodiment of FIG. 8 is the elimination of analog signal processing and, therefore, the elimination of temperature considerations as regards the earlier illustrated memory element 104. That is, the delay control signal in the embodiment of FIG. 8 eliminates any considerations of analog capacitor voltage droop and the delay control signal may be held indefinitely or updated as frequently as desired.

Figure 9:
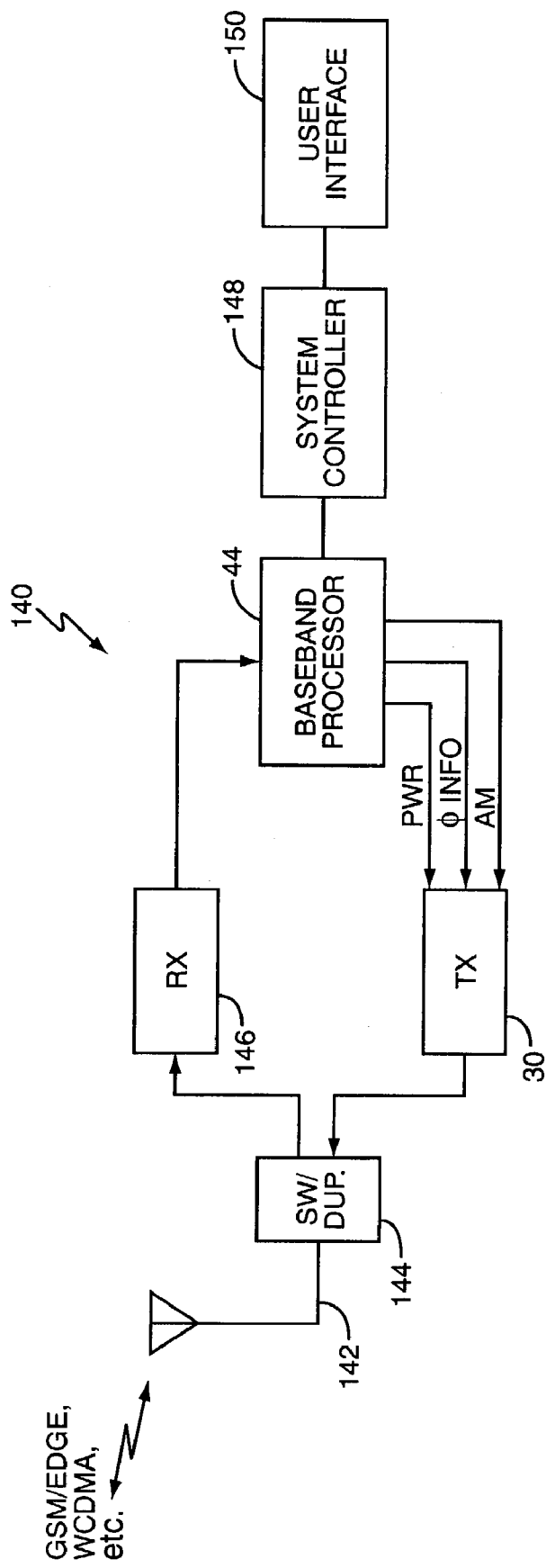
FIG. 9 is a diagram of an exemplary mobile station according to an exemplary embodiment of the present invention.

FIG. 9 illustrates an exemplary mobile station 140, a cellular radiotelephone for example, that may incorporate the transmitter 30 according to the embodiment of FIG. 8, any earlier embodiments, or any variations thereof. Mobile station 140, in addition to the transmitter 30 and baseband procecessor 44 described earlier herein, comprises an antenna assembly 142, a switch/duplexer 144, a receiver 146, a system controller 148, and a user interface 150. Those skilled in the art will appreciate that the particular implementation of mobile station 140 is subject to much variation and its general details are not germane to understanding the present invention.

Nonetheless, one may note that transmitter 30 may be particularly advantageous where mobile station 140 supports WCDMA-formatted signal transmissions, and thus must control the transmit power of its transmit signal from transmitter 30 over an 80 dB range. Similar advantages may be gained where mobile station 140 is a GSM/EDGE compatible terminal, or where mobile station 140 supports both EDGE and WCDMA standards. Further, it may be noted that mobile station 140 may be advantageously implemented with a higher degree of circuit integration by implementing the driver amplifier circuit 34 as part of an integrated transmitter or transceiver IC, that may be part of baseband processor 44, or implemented as a separate IC from baseband processor 44.

On that point, referring back to the context of FIG. 8, it should be noted that the delay controller 80 may be implemented almost wholly in the baseband processor 44, or may be implemented within a transmitter or transceiver IC that includes, for example, the phase modulator 42 and the saturated driver amplifier 34. Nonetheless, the present invention is not limited to such embodiments, and other functional and physical arrangements of circuits may be used as needed or desired.

Indeed, the flexibility with regard to digital or analog domain signal processing in the delay controller 80 exemplifies the overall flexibility of the transmitter 30 contemplated by the present invention. Thus, as described herein, the present invention is directed to a transmitter that includes an extended dynamic range staged envelope modulation circuit, or that includes a delay controller that controls the group delay of the transmitter's phase modulation signal path and/or envelope modulation signal path based on real-time ACPR measurement, or that includes both features. As such, the present invention is not limited by the above exemplary details, or by the accompanying figures, but rather is limited only by the following claims and the reasonable equivalents thereof.

What is claimed is:

1. A method of generating a radio frequency output signal based on polar modulation, the method comprising:
generating a phase-modulated signal responsive to an input phase-modulation information signal;
generating the output signal by imparting envelope-modulation to the phase-modulated signal responsive to an input envelope-modulation information signal;
measuring an adjacent channel power ratio (ACPR) for the output signal by feeding back a portion of the output signal via a feedback circuit that generates a baseband measurement signal, detecting an envelope of the baseband measurement signal over a first bandwidth to obtain a first detection signal, and detecting an envelope of the baseband measurement signal over a second bandwidth to obtain a second detection signal, and obtaining an ACPR measurement signal by subtracting the second detection signal from the first detection signal; and
controlling a relative delay between the phase-modulated and envelope-modulated information signals to reduce the measured ACPR.

2. The method of claim 1, wherein controlling the relative delay between the phase-modulated and envelope-modulated information signals to reduce the measured ACPR comprises adjusting a bandwidth of a filter used to filter one of the envelope modulation or the phase modulation information signals.

3. The method of claim 2, wherein adjusting the bandwidth comprises increasing or decreasing the bandwidth of the filter to reduce the measured ACPR.

4. The method of claim 1, wherein controlling the relative delay between the phase-modulated and envelope-modulated information signals to reduce the measured ACPR comprises adjusting a digital delay of one or both the phase-modulated and envelope-modulation information signals at a waveform generator that generates the phase-modulated and envelope-modulated information signals based on desired transmit signal data.

5. A method of generating a radio frequency output signal based on polar modulation, the method comprising:
  generating a phase-modulated signal responsive to an input phase-modulation information signal;
  generating the output signal by imparting envelope modulation to the phase-modulated signal in tandem using a tail-current modulated driver amplifier circuit responsive to a first scaled envelope modulation signal and a supply-modulated power amplifier circuit responsive to a second scaled envelope modulation signal; and
  scaling an input amplitude modulation information signal by one or more scaling factors to generate the first and second scaled modulation signals as a function of the desired transmit power level.

6. The method of claim 5, wherein scaling an input amplitude modulation information signal by one or more scaling factors to generate the first and second scaled modulation signals as a function of an input power control signal corresponding to the desired transmit power level comprises:
  in a first mode of operation, generating the first scaled envelope modulation signal as a steady state value and generating the second scaled envelope modulation signal as a scaled version of the input envelope modulation information signal; and
  scaling the second scaled envelope modulation signal as a function of an input power control signal corresponding to the desired transmit power.

7. The method of claim 6, wherein scaling an input amplitude modulation information signal by one or more scaling factors to generate the first and second scaled modulation signals as a function of an input power control signal corresponding to the desired transmit power level further comprises:
  in a second mode, generating the first and second scaled envelope modulation signals as scaled versions of the input envelope modulation information signal; and
  scaling the first and second scaled envelope modulation signal as a function of an input power control signal corresponding to the desired transmit power.

8. The method of claim 7, further comprising operating in the first mode for a first range of transmit power control and operating in the second mode for a second, greater range of transmit power control.

9. The method of claim 5, further comprising implementing the driver amplifier circuit as a portion of a transmitter integrated circuit (IC), and implementing the power amplifier circuit separately from the transmitter IC, such that envelope modulation of the phase-modulated signal is achieved by coordinated operation of the transmitter IC and the power amplifier circuit.

10. The method of claim 5, further comprising:
  measuring an adjacent channel power ratio (ACPR) for the output signal; and
  controlling a relative delay between the input phase-modulation information signal and the input envelope-modulation information signal as a function of the measured ACPR to reduce the ACPR of the output signal.

11. A radio frequency polar modulation transmitter to generate a RF output signal at a desired transmit power, the transmitter comprising:
  a transmitter circuit that generates a phase-and-envelope modulated output signal based on separate phase-modulation and envelope-modulation information signals input to the transmitter circuit; and
  a delay controller comprising a feedback circuit to obtain an analog feedback signal associated with the output signal of the transmitter, a measurement circuit, including first and second envelope detectors and an associated differencing amplifier, to generate an ACPR measurement signal based on the analog feedback signal, and a control circuit to generate a delay control signal responsive to the ACPR measurement signal, the delay controller configured to control a relative delay between the phase-modulation and envelope-modulation signals based on performing real-time ACPR measurement for the output signal.

12. The transmitter of claim 11, wherein the delay controller comprises a feedback controller operative to control a value of the delay control signal so as to reduce measured ACPR as indicated by the ACPR measurement signal.

13. The transmitter of claim 11, wherein the measurement circuit includes a filter associated with a first one of the envelope detectors that is operative to filter the feedback signal such that the first envelope detector receives feedback signal components corresponding to adjacent channel power in the output signal, and wherein a second one of the envelope detectors receives a full bandwidth version of the feedback signal.

14. The transmitter of claim 11, wherein the measurement circuit comprises:
  an analog feedback circuit to obtain a feedback signal associated with the output signal;
  a digitization circuit to obtain a digitized feedback signal from the analog feedback signal; and
  a digital control circuit to obtain an ACPR measurement based on signal processing of the digitized feedback signal.

15. The transmitter of claim 14, wherein the digital control circuit is further operative to generate a delay control signal based on the ACPR measurement, and wherein the delay controller includes a digital delay element to control a relative delay between the phase-modulation information signal and the envelope-modulation information signal.

16. The transmitter of claim 11, wherein the transmitter circuit includes:
  a phase modulation circuit to generate a phase-modulated signal responsive to the input phase-modulation information signal;
  a staged saturated amplifier circuit comprising a driver amplifier circuit comprising differential transistor pairs that impart envelope modulation responsive to tail-current modulation, and further comprises a power amplifier circuit coupled to an output of the driver amplifier circuit that imparts envelope modulation responsive to supply signal modulation, the staged saturated amplifier circuit operative to generate the output signal by imparting envelope modulation to the phase-modulated signal responsive to scaled envelope modulation signals; and a power controller to generate the scaled envelope modulation signals based on the input envelope-modulation information signal and an input power control signal.

17. The transmitter of claim 16, wherein the transmitter comprises a transmitter integrated circuit (IC) that includes the driver amplifier circuit, and further includes the power amplifier circuit implemented separately from the transmitter IC.

18. The transmitter of claim 16, wherein the power controller selectively controls whether the driver amplifier imparts envelope modulation by controlling whether the scaled envelope modulation signals provided to the driver amplifier are held at a steady state value or modulated according to the input envelope modulation information signal, such that the power amplifier circuit is used for envelope modulation in a first mode and both the power amplifier and driver circuit are used together to provide envelope modulation in a second mode.

19. The transmitter of claim 18, wherein the power controller operates in the first mode for a portion of a transmit power control range and operates in the second mode for a remaining portion of a transmit power control range.

20. A radio frequency polar modulation transmitter to generate a RF output signal at a desired transmit power, the transmitter comprising:
a phase modulator to generate a phase-modulated signal responsive to an input phase modulation information signal;
a staged saturated amplifier to generate the output signal by imparting envelope modulation to the phase-modulated signal;
said staged saturated amplifier comprising:
a driver amplifier circuit to impart envelope modulation to the phase-modulated signal responsive to a first scaled envelope modulation signal;
a power amplifier circuit coupled to the driver amplifier circuit to impart envelope modulation to the phase-modulated signal responsive to a second scaled envelope modulation signal; and
a power controller to generate the first and second scaled envelope modulation signals based on the input envelope modulation information signal and the desired transmit power.

21. The transmitter of claim 20, wherein the transmitter operates in a first mode wherein the driver amplifier circuit is operated as a pass-through circuit and only the power amplifier circuit is used to impart envelope modulation to the phase-modulated signal, and operates in a second mode wherein the driver amplifier circuit and the power amplifier circuit are operated in tandem to impart envelope modulation to the phase-modulated signal.

22. The transmitter of claim 21, wherein the first mode is active for a first range of transmit power control, and wherein the second mode is active for a second, greater range of transmit power control.

23. The transmitter of claim 21, wherein the transmitter is configured to support EDGE-format transmissions and WCDMA-format transmissions, and wherein the transmitter operates in the first mode for EDGE-format transmissions and operates in the second mode for WCDMA-transmissions.

24. The transmitter of claim 21, wherein the transmitter is configured to support WCDMA-format transmissions, and wherein the transmitter operates in the first mode for a first portion of a required transmit power control range, and operates in the second mode, as needed, for a remaining portion of the required transmit power control range.

25. The transmitter of claim 20, wherein the driver amplifier circuit comprises a tail-current modulated differential transistor pair operated in saturated mode.

26. The transmitter of claim 25, wherein the differential transistor pair includes a differential input coupled to a quadrature output of the phase modulator, and includes a differential output coupled to an input of the power amplifier circuit.

27. The transmitter of claim 25, wherein the differential transistor pair is operative to pass-through the phase-modulated signal for envelope modulation by the power amplifier circuit if the first scaled envelope modulation signal is held at a steady state, and is operative to impart envelope modulation in tandem with the power amplifier circuit if the first scaled envelope modulation signal is made responsive to the input envelope-modulation information signal.

28. A radio frequency polar modulation transmitter to generate a RF output signal at a desired transmit power, the transmitter comprising:
a phase modulator to generate a phase-modulated signal responsive to an input phase-modulation information signal;
a staged amplifier circuit comprising a driver amplifier circuit to impart envelope modulation to the phase-modulated signal responsive to a first scaled envelope modulation signal, a power amplifier circuit to impart envelope modulation to the phase-modulated signal responsive to a modulated supply signal, a power amplifier controller to generate the modulated supply signal responsive to a second scaled envelope modulation signal, and a power controller to generate the first and second scaled envelope modulation signals responsive to an input envelope-modulation information signal and based on the desired transmit power, the staged amplifier circuit configured to generate an output signal by imparting envelope modulation to the phase-modulated signal responsive to an input amplitude modulation information signal; and
a delay controller to control a relative delay between the input phase-modulation and envelope-modulation information signals responsive to a measured adjacent channel power ratio (ACPR) of the output signal.

29. The transmitter of claim 28, wherein the driver amplifier and power amplifier circuits operate in tandem to impart synchronized envelope modulation to the phase-modulated signal.

* * * * *